United States Patent [19]

Josephson et al.

[11] Patent Number: 4,792,746

[45] Date of Patent: Dec. 20, 1988

[54] NON-DISSIPATIVE SERIES VOLTAGE SWITCHING REGULATOR HAVING IMPROVED SWITCHING SPEED

[75] Inventors: Elliot Josephson, Woodside; Frederick S. Parker, Ben Lomond, both of Calif.

[73] Assignee: Astec Components, Ltd., Santa Clara, Calif.

[21] Appl. No.: 48,215

[22] Filed: May 11, 1987

[51] Int. Cl.⁴ .................. G05F 1/56; H02M 3/156
[52] U.S. Cl. ................................. 323/290; 307/571
[58] Field of Search ............... 323/282, 288, 289, 290, 323/351; 307/571

[56] References Cited

U.S. PATENT DOCUMENTS

| | | | |
|---|---|---|---|
| 4,445,055 | 4/1985 | Bete | 323/351 |
| 4,455,526 | 6/1984 | Miller | 323/289 |
| 4,459,539 | 7/1984 | Cordy | 323/288 |
| 4,521,725 | 6/1985 | Phaneuf | 323/282 |
| 4,553,082 | 11/1985 | Nesler | 323/288 |
| 4,565,931 | 1/1986 | Fumey | 307/571 |
| 4,607,210 | 8/1986 | Ohms et al. | 323/290 |
| 4,634,903 | 1/1987 | Montorfano et al. | 323/290 |

Primary Examiner—William H. Beha, Jr.
Attorney, Agent, or Firm—Fitch, Even, Tabin & Flannery

[57] ABSTRACT

A FET switching regulator has a FET switch which is periodically turned on to couple an unregulated DC input voltage to an output filter which develops a regulated output DC voltage. Regulation of the output DC voltage is determined by the on time or duty cycle of the FET switch. A periodic waveform is developed by a pulse-width modulator. The pulse-width modulator compares the input and output DC voltages to a reference voltage to pulse-width modulate the periodic waveform to determine the duty cycle. When the periodic waveform goes high, it triggers a first regenerative circuit which drives the gate of the FET switch into saturation within 20-30 nanoseconds. When the periodic waveform goes low, a second regenerative circuit is triggered to return the FET switch to an off state within 20-30 nanoseconds. Accordingly, the FET switch may be operated at frequencies approaching 500 kHz without excessive power losses within the FET switch in the transitory states between cutoff and saturation. The regenerative circuits may be blocking oscillators.

14 Claims, 2 Drawing Sheets

NON-DISSIPATIVE SERIES VOLTAGE SWITCHING REGULATOR HAVING IMPROVED SWITCHING SPEED

The present invention relates generally to series voltage switching regulators, and more particularly to improvements in the turn-on and turn-off time of a FET switch used in such regulators.

BACKGROUND OF THE INVENTION

A typical transistor switching regulator provides a well-regulated output DC voltage from an unregulated input DC voltage. Periodically, an unregulated input DC voltage is coupled to a conventional LC output filter of the switching regulator which develops the output DC voltage. Thus, a pulse modulated, unregulated DC voltage is applied to the output filter. Regulation of the duty cycle of the periodic switching of the input DC voltage to the output filter provides for regulation of the output DC voltage. For example, when a load being driven by the switching regulator is drawing a relatively low current from the output filter, the duty cycle of the periodic switching of the input DC voltage to the output filter need only be relatively small to maintain a constant charge on the output capacitor of the LC filter thereby keeping the output DC voltage regulated. Conversely, when the load is drawing a relatively high current from the output filter, the duty cycle of the periodic switching of the input DC voltage to the output filter will need to be large to maintain the output voltage in regulation. Usually, the duty cycle is determined from a comparison of the output DC voltage and a reference voltage Most known transistor switching regulators operate at a frequency between 20 kHz and 50 kHz. This frequency range is selected to be above audio frequencies to minimize audible hum emanating from the switching regulator. The upper limit of the frequency range is determined by the turn-on and turn-off times of the transistor switch used for the periodic switching of the input DC voltage to the output filter. Since a transistor switch cannot instantaneously switch between substantially zero resistance in its on state to a very large resistance in its off state, it momentarily operates in a linear range during the time that it is switching between these two states. During these transitions, the transistor switch dissipates power from the resistive losses of the current through the transistor switch. As long as the turn-on and turn-off transition times of the transistor switch are relatively small with respect to the frequency of the switching, and especially with respect to the on portion of the duty cycle of the transistor switch, the dissipative power losses, although undesirable, are relatively insignificant. For example, a typical bipolar transistor switch has turn-on and turn-off transition times on the order of 100–200 nanoseconds, which are relatively insignificant even when compared to the 20 microsecond time period of a 50 kHz switching frequency.

Improvements in turn-on and turn-off transition times in this frequency range may be achieved by using a FET power switch, which consequently allows the FET switch to be operated at higher frequencies than a bipolar switch.

However, a FET switch cannot be arbitrarily operated at continually higher frequencies. As with bipolar transistor switches, the FET switch must be turned completely on into saturation, during the on portion of the duty cycle and must be completely turned off, i.e. into cutoff, during the off portion of the duty cycle to avoid operation in its linear power amplifier range wherein the channel resistance of the FET switch is dissipating power.

Because a power FET switch is characterized by a relatively high gate-source capacitance, the charging and discharging times of this capacitance limit the turn-on and turn-off transition times of the FET switch, and thereby determine the highest practical frequency of the periodic switching. At arbitrarily higher frequencies, the efficiency of the FET switching regulator is seriously and unacceptably degraded. In the extreme, the FET switching regulator may fail to keep the output voltage in regulation, or the FET switch itself will fail as a result of excessive heat from dissipative power losses in its channel.

However, it would be desirable to operate the FET switching regulator at a very high frequency, for example, on the order of 500 kHz. The desirability of operating a FET switching regulator at very high operational frequencies is two-fold. As the frequency of the pulse modulated, unregulated DC voltage applied to the output stage becomes higher, the value of the inductors and capacitors in the output filter may be correspondingly less. Consequently, these smaller inductances and capacitances provide advantages in reducing both the physical size of the output filter and in cost.

In order to increase the switching frequency of the FET switch by a factor of ten, from the usual highest practical frequency of 50 kHz to a more desirable 500 kHz, it is necessary to correspondingly decrease the turn-on and turn-off transition times of the FET switch. However, as stated above, these transistion times are limited by the relatively large gate-source capacitance of the FET switch. The gate of the FET switch, in known prior art switching regulators, is driven by a periodic waveform developed by a pulse-width modulator. The pulse-width modulator compares the output DC voltage to a reference voltage and applies a relatively constant voltage to the gate of the FET switch for a determined time during the on portion of the duty cycle. Such pulse-width modulators, although capable of developing periodic waveforms in the desired frequency range of approximately 500 kHz, are incapable of sufficiently driving the gate of the FET switch by rapidly charging and discharging the gate-source capacitor to obtain this operational frequency of the FET switching regulator.

SUMMARY OF THE INVENTION

It is therefore an object of the present invention to provide a FET switching regulator which overcomes one or more of the disadvantages and limitations hereinabove described.

An important object of the present invention is to provide an apparatus for driving the gate of the FET switch to improve the turn-on and turn-off transition times thereof.

According to the present invention, an improved FET switching regulator circuit decreases the turn-on and turn-off transition times of the FET switch in such regulators. Instead of driving the gate of the FET switch with the periodic switching waveform developed by the pulse-width modulator, the duty cycle on portion of the switching waveform triggers a first regenerative circuit to drive the gate of the FET switch. The current output of the regenerative circuit is coupled to the gate and charges the gate-source capacitor with a rise time that is significantly faster than in the prior art. Similarly, the duty cycle off portion of the periodic waveform triggers a second regenerative circuit to turn off the FET switch. The second regenerative circuit draws a current out from the gate-source capacitor until all charge has been removed. Thus, the fall time of the FET switch is also significantly faster than in the prior art.

These and other objects, advantages and features of the present invention will become more apparent from the following description and the accompanying drawings.

DESCRIPTION OF THE PREFERRED EMBODIMENT

Figure 1:
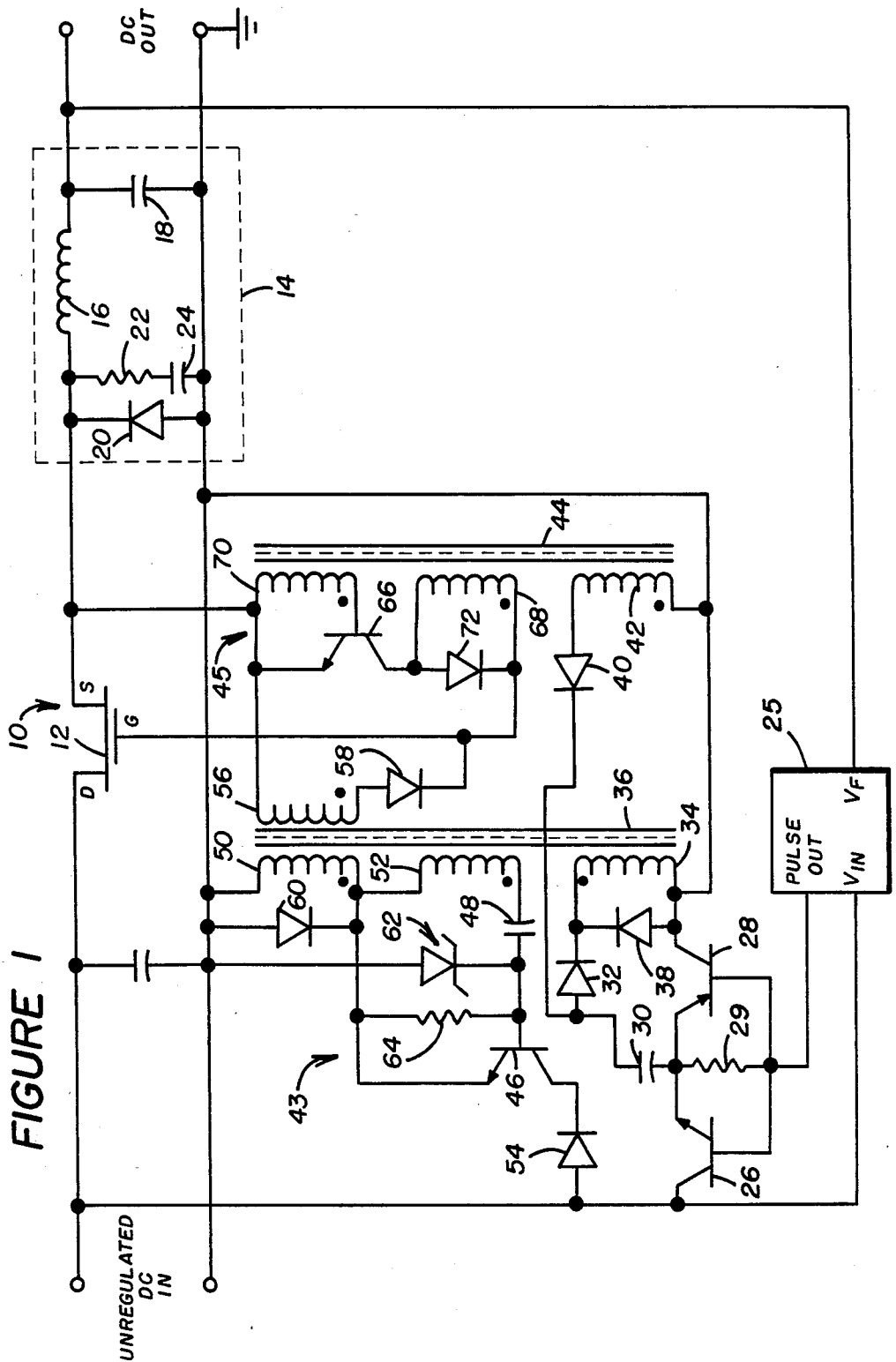
FIG. 1 is a schematic circuit diagram of a FET switching regulator according to the principles of the present invention.

Referring now to the drawings, FIG. 1 shows a FET switching regulator 10 constructed according to the principles of the present invention. Regulator 10 includes a FET switch 12 having a gate (G), source (S) and drain (D), and an output filter means 14. The unregulated DC input voltage is applied to the drain of the FET switch 12, and the source of the FET switch 12 is coupled to the output filter means 14.

When the FET switch 12 is turned on, the unregulated DC input voltage is coupled to the output filter means 14. Output filter means 14 includes an inductor 16 and a capacitor 18 and functions to filter the unregulated DC voltage to develop the regulated output DC voltage. The output voltage is regulated by the on time of FET switch 12, as is known in the art of switching regulators. The inductive and capacitive values of inductor 16 and capacitor 18 are selected in accordance with the frequency of operation of switching regulator 10. The present invention is particularly useful for increasing the operational frequency of switching regulator 10 so that the inductive and capacitive values used in output filter means 14 may be smaller than in prior art switching regulators. As these values become smaller, there is a corresponding decrease in size and cost of switching regulator 10.

Output filter means 14 also includes a snubber circuit including a diode 20 in parallel with an RC circuit comprising a resistor 22 and a capacitor 24. The snubber circuit conventionally eliminates voltage spikes which may occur at the source of the FET switch 12 when it is turned off. Diode 20 also provides a current path for a load connected to the DC OUT terminals of switching regulator 10 when the FET switch 12 is off.

Regulation of the DC output voltage is accomplished by regulating the on time of FET switch 12. The duty cycle regulation of FET switch 12 is determined by a conventional pulse-width modulator 25 which compares the output voltage and the input voltage to an internal reference voltage. Pulse-width modulator 25 develops a periodic waveform having a duty cycle determined by the output voltage. In the prior art, this periodic waveform is coupled to the gate of FET switch 12, so that FET switch 12 is turned on during the on portion of the waveform. When the output voltage is in regulation, the on portion of the periodic waveform is relatively smaller than when the output voltage is being excessively loaded during large current demands of an output load.

According to the present invention, the periodic waveform developed by pulse-width modulator 25 is coupled to two regenerative circuits 43 and 45 which develop signals of increasing magnitude to the FET switch until it completes the transition from off to on or vice versa. Preferably, circuits 43 and 45 are blocking oscillator stages. Triggering of each of these circuits is by means of a trigger comprising preferably a transformer coupled signal, as hereinafter described.

More specifically, the periodic waveform from modulator 25 is applied to a push-pull amplifier pair which includes a first transistor 26, and a second transistor 28. Second transistor 28 is defined to be of opposite conductivity type from first transistor 26. The periodic waveform is coupled to the base of each of the transistors 26 and 28. The collector of the first transistor 26 is coupled to the unregulated DC input voltage. The emitter of the first transistor 26 is coupled to the emitter of the second transistor 28. The collector of the second transistor 28 is coupled to a common reference potential of switching regulator 10, such as ground. A resistor 29 is coupled between the base and emitter of each of first transistor 26 and second transistor 28.

The emitters of transistors 26 and 28 are coupled to a first plate of a capacitor 30. The second plate of the capacitor 30 is coupled to the anode of a diode 32. The cathode of diode 32 is coupled to the dotted side of a "trigger" winding 34 of a transformer 36. The undotted side of winding 34 is coupled to ground. In parallel with trigger winding 34 is a diode 38 with its anode coupled to ground.

Also coupled to the second plate of capacitor 30 is the cathode of a diode 40. The anode of diode 40 is coupled to the undotted side of a "trigger" winding 42 of a second transformer 44. The dotted side of winding 42 is coupled to ground.

As hereinbelow described, first transistor 26, capacitor 30 and trigger winding 34 comprise means for triggering a first regenerative circuit 43 which turns on FET switch 12. Second transistor 28, capacitor 30 and trigger winding 42 comprise means for triggering a second regenerative circuit 45 which turns off FET switch 12. Each of regenerative circuits 43 and 45 are configured as blocking oscillators and are hereinbelow more fully described.

First regenerative circuit 43 which turns on FET switch 12 includes a transistor 46, a capacitor 48, a primary winding 50 of transformer 36, and a regenerative base drive winding 52. Capacitor 48 is coupled in series between the base of transistor 46 and the dotted side of the regenerative base driving winding 52. The emitter of transistor 46 is coupled to the dotted side of the primary winding 50 and also to the undotted side of the regenerative base drive winding 52. The undotted side of the primary winding is coupled to ground. A diode 54 is coupled between the collector of transistor 46 and the unregulated DC input voltage, with the cathode thereof coupled to the collector. First regenerative circuit 43 also includes a secondary winding 56 of first transformer 36 and a diode 58. The cathode of diode 58 is coupled to the gate of FET switch 12 and its anode connected to the dotted side of secondary winding 56. The undotted side of secondary winding 56 is coupled to the source of FET switch 12. Finally, first regenerative circuit 43 also includes a diode 60 in parallel with primary winding 50 with its anode coupled to ground, a resistor 64 coupled between the base and emitter of transistor 46, and a zener diode 62. The cathode of zener diode 62 is coupled to the base of transistor 46, with its anode coupled to ground.

Second regenerative circuit 45 which turns off FET switch 12 includes a transistor 66, a primary winding 68 of the second transformer 44 and a regenerative base drive winding 70 of transformer 44 and a diode 72. The dotted side of the primary winding 68 is coupled to the gate of FET switch 12 and its undotted side coupled to the collector of transistor 66. The regenerative base drive winding 70 has its dotted side coupled to the base of transistor 66 and its undotted side coupled to the emitter of transistor 66 and also to the source of FET switch 12. Diode 72 is coupled in parallel with primary winding 68 with its anode coupled to the undotted side thereof.

The turn-on and turn-off of the FET switch 12 is initiated by the periodic waveform developed by the pulse width modulator 25. Modulator 25 compares the output voltage with an internal preset reference voltage and modulates the duty cycle of the periodic waveform as a function of this comparison while maintaining a substantially constant frequency. Pulse-width modulators of the type described herein are commercially available and need not be further described.

When the periodic waveform goes high, initiating the on portion of the duty cycle, transistor 26 is turned on thereby raising the voltage at its emitter. More specifically, the periodic waveform causes an IR voltage drop across resistor 29 with a polarity which forward biases the base-emitter junction of the npn type transistor 26. After transistor 26 is turned on, the rising emitter voltage approaches the voltage of the periodic waveform to turn transistor 26 off. Thus, transistor 26 develops a voltage pulse at its emitter.

This voltage pulse is coupled through capacitor 30 to forward bias diode 32. The resultant current through capacitor 30 causes a further voltage pulse to be induced across trigger winding 34 of transformer 36. This current also quickly charges capacitor 30. The voltage pulse across trigger winding 34 is coupled to the base drive winding 52. The voltage pulse is coupled across a capacitor 48 to turn on transistor 46. As transistor 46 turns on, the diode 54 becomes forward biased to allow a collector current therethrough. The emitter current is coupled to the emitter winding 50. The voltage induced across emitter winding 50 is regeneratively coupled back to base drive winding 52 to quickly drive transistor 46 into saturation. As the voltage across base drive winding 52 increases, the current applied to the base of transistor 46 is the derivative of such voltage by the action of capacitor 48. The increasing voltage developed across emitter winding 50 is magnetically coupled to secondary winding 56. As diode 58 becomes forward biased, the increasing voltage across winding 56 is applied to the gate of FET switch 12. Since FET switch 12 is characterized by a relatively large capacitance between the gate and source thereof, the increasing voltage allows current to be constantly applied to the gate to charge this capacitor to turn on FET switch 12 quicker than if a constant voltage, such as developed by pulse-width modulator 25, had been applied thereto. The present invention provides for charging the gate-source capacitor so that FET switch 12 is turned on to saturation within 20-30 nanoseconds.

Zener diode 62 provides a means for limiting the voltage applied to the gate of FET switch 12. As the voltage across each of windings 50 and 52 increases, zener diode 62 will turn on when a preselected voltage at the dotted side of base drive winding 50 has been reached. This will clamp the voltage across emitter winding 50 and hence the voltage coupled to secondary winding 56. In one embodiment of the present invention, zener diode 62 has a reverse breakdown voltage in the range of 12-15 volts. This voltage is selected to be less than the breakdown voltage of the gate of FET switch 12, which is typically 20-25 volts.

When the periodic waveform generated by pulse width modulator 25 changes state, or goes low, to initiate the off portion of the duty cycle, transistor 28 is turned on, thereby lowering the voltage at its emitter. More specifically, the periodic waveform causes the IR voltage drop across resistor 29 to have a polarity which forward biases the base-emitter junction of the pnp type transistor 28. After transistor 28 is turned on, the lowering emitter voltage approaches the voltage of the periodic waveform to turn transistor 28 off. Thus, transistor 28 develops a voltage pulse at its emitter.

This voltage pulse is coupled through capacitor 30 to forward bias diode 40. The resultant current through capacitor 30 causes a further voltage pulse be induced across trigger winding 42 of transformer 44. This pulse is magnetically coupled to the base drive winding 70 which turns on transistor 66. The collector current of transistor 66 is coupled through primary winding 68. The voltage induced across winding 68 is regeneratively coupled to base drive winding 70 to quickly drive transistor 66 into saturation. The voltage across winding 68 is also applied to the gate of FET switch 12. Thus, the increasing collector current of transistor 66 in effect draws charge from the gate source capacitance of FET switch 12 to turn FET switch 12 off. Typically, FET switch 12 is turned off within 20-30 nanoseconds.

Also, when transistor 66 turns on, the polarity across secondary winding 56 changes, polarity. This change of polarity is magnetically coupled to emitter winding 50 in base drive winding 52. When emitter winding 50 changes polarity, diode 60 becomes forward biased to provide a short across this winding to prevent self oscillation of the blocking oscillator circuit. However, a current flows out of the undotted side of winding 52 through resistor 64 to charge capacitor 48. The initial charge on capacitor 48 quickens further the turn-on of transistor 46 as hereinabove described. Also, when trigger winding 34 changes polarity, diode 38 becomes forward biased to short this winding.

Transistor 66 will remain on until all charge has been removed from the gate-source capacitance of FET switch 12. When this gate-source capacitor has been discharged, the polarity of winding 68 reverses forward biasing diode 72 to short such winding out thereby preventing blocking oscillator 45 from self oscillation.

Figure 2:
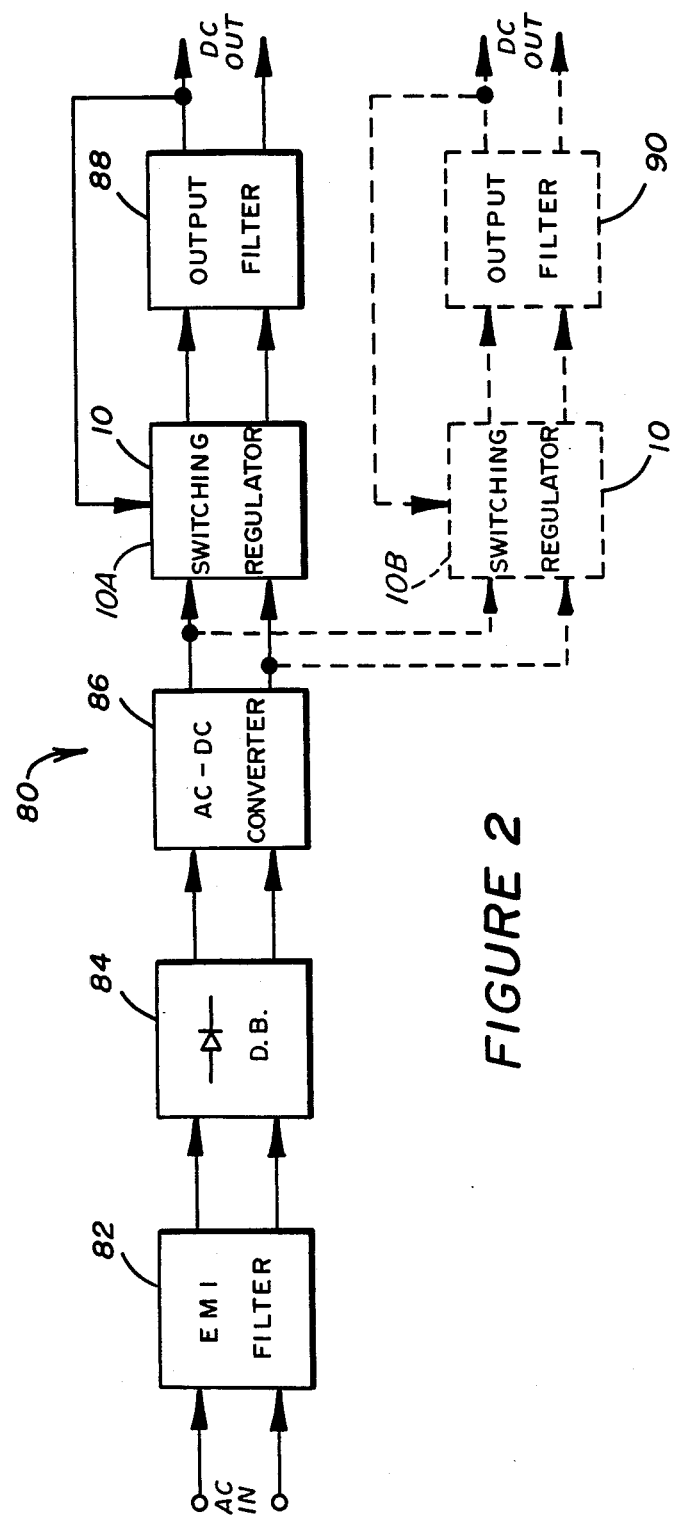
FIG. 2 is a schematic block diagram illustrating one use of the FET switching regulator of the present invention.

Referring now to FIG. 2, there is shown a typical power supply circuit 80 incorporating one or more switching regulators 10A and 10B, as hereinabove described. Power supply circuit 80 converts input AC power, typically from a line at 120 volts, to one or more DC voltage levels, e.g., 5, 12 and 25 volts. These output DC voltages are the most commonly used in electronic and integrated circuit systems.

More specifically, the input AC line voltage is applied to a conventional EMI filter 82 for eliminating electromagnetic interference from the AC line. After this filtering, the AC voltage is applied to a conventional diode bridge rectifier 84 that full wave rectifies the AC voltage. The rectified voltage is applied to an AC-DC converter 86. Converter 86 may be any known AC-DC converter which develops an unregulated DC voltage from an unregulated input AC voltage.

The unregulated DC voltage developed by AC-DC converter 86 may be applied to one or more switching regulators 10 of the type as hereinabove described. Regulator 10A, for example, may operate to output 5V DC, and regulator 10B may operate to output 12V DC. The regulated output DC voltage produced by each switching regulator 10A and 10B is coupled to a respective output filter 88 and 90. These filters are functionally equivalent to filter 14 in FIG. 1. Output filter 88 and output filter 90 are of conventional design and have component values selected to provide desired filtering at the DC output voltage developed by its associated switching regulator 10. Further switching regulators 10 may be added to power supply circuit 80 to provide further output DC voltages.

It is, of course, understood that although the preferred embodiments of the present invention have been illustrated and described, various modifications, alternatives and equivalents thereof will become apparent to those skilled in the art. Accordingly, the scope of the present invention should be defined and limited only by the appended claims and equivalents thereof.

What is claimed is:

1. In a switching regulator having output filter means for generating a smoothed output voltage from an unregulated input DC voltage, transistor switch means for periodically coupling an unregulated input DC voltage to said output filter means, and means for developing a periodic waveform having a duty cycle determined by said output voltage, said transistor switch means coupling said input voltage to said output filter means during the on portion of said duty cycle to regulate said output voltage, the improvement comprising:
    first regenerative circuit means comprising a blocking oscillator, said means responsive to said periodic waveform changing state to the on portion of said duty cycle for developing a first signal of increasing magnitude, said switch means turning on in response to said first signal to couple said input voltage to said output filter means; and
    second regenerative circuit means comprising a blocking oscillator, said means responsive to said periodic waveform changing state to the off portion of said duty cycle for developing a second signal of iincreasing magnitude and having a polarity opposite to said first signal, said transistor switch means turning off in response to said second signal.

2. A switching regulator as set forth in claim 1, further comprising:
    means for clamping said first signal to a selected voltage.

3. A switching regulat or as set forth in claim 1 wherein said output filter means includes means for storing sufficient electrical energy coupled from said transistor switch means during said on portion of said duty cycle to enable said output voltage to remain at a predetermined substantially constant voltage during both said on and said off portions of said duty cycle.

4. A FET switching regulator for devolping a regulated output DC voltage from an unregulated input DC voltage including output filter menas for generating said output voltage, a FET switch having a source coupled to said output filter means, a gate and a drain to which said input voltage is applied, and means for generating a periodic waveform having a duty cycle determined as a function of said output voltage, said FET switch being turned an during the on portion of said duty cycle to couple said input voltage to said output voltage, the improvement comprising:
    first regenerative circuit means comprising a blocking oscillator, said means responsive to said periodic waveform changing state to the on portion of said duty cycle for developing a first signal and for coupling said first signal to said gate to turn on said FET switch, said first signal having a voltage which continually increases in magnitude until said FET switch goes on; and
    second regenerative circuit means comprising a blocking oscillator, said means responsive to said periodic waveform changing state to the off portion of said duty cycle for developing a second signal and for coupling said second signal to said gate to turn off said FET switch, said second signal having a voltage which continually incerases in magnitude in the opposite polarity with respect to said first signal until said FET switch goes off.

5. The FET switching regulator as set forth in claim 4 wherein said first signal developing means includes:
    means responsive to said periodic waveform changing state to said on portion of said duty cycle for generatlng a first trigger pulse;
    a transistor having a base, collector nad emitter, said collector being coupled to said input DC voltgge; and
    a transformer having a first winding coupled between said base and said emitter, a second winding coupled between said emitter and a common potential reference of said regulator, and a third winding coupled between said gate and said source, said trigger pulse inducing a voltage across said first winding to turn on said transistor, the voltage of said second winding being regeneratively coupled to said third winding, said third winding developing said first signal.

6. The FET switching regulator as set forth in claim 5 wherein said first signal developing means further includes a capacitor in series with said first winding.

7. The FET switching regulator as set forth in claim 6 wherein said capacitor is coupled between said base and said first winding.

8. The FET switching regulator in accordance with claim 7 wherein said first signal developing means further includes a resistor coupled between said base and said second winding to provide a current path for charging said capacitor when said transistor turns off.

9. The FET switching regulator in accordance with claim 5 wherein said first signal developing means further includes at least one diode in series with said third winding and arranged to be forward biased when said third winding is developing said first signal.

10. The FET switching regulator as set forth in claim 5 further including means for clamping the voltage at said gate of said FET switch at a predetermined maximum which is less than the breakdown voltage of said FET switch.

11. The FET switching regulator as set forth in claim 10 wherein said clamping means includes a zener diode coupled to said gate of said FET switch.

12. The FET switching regulator as set forth in claim 4 wherein said second signal developing means includes:
  means responsive to said periodic waveform changing state to said off portion of said duty cycle for generating a second trigger pulse; a transistor having a base, collector and emitter, said emitter being coupled to said source of said FET switch; and
  a transformer having a first winding coupled between said base and said emitter, and a second winding coupled between said collector and said gate, said trigger pulse inducing a voltage across said first winding to turn on said transistor, the voltage of said second winding being regeneratively coupled to said first winding, said second winding developing said second signal.

13. The FET switching regulator as set forth in claim 12 wherein said second signal developing means further includes a diode in series with said second winding and being arranged to be forward biased when said transistor turns off.

14. The FET switching regulator as set forth in claim 12 further including a diode, coupled across said second winding and being arranged to become forward biased when said transistor turns off.

* * * * *

UNITED STATES PATENT AND TRADEMARK OFFICE
CERTIFICATE OF CORRECTION

PATENT NO. : 4,792,746

DATED : December 20, 1988

INVENTOR(S) : Elliot Josephson, et al.

It is certified that error appears in the above-identified patent and that said Letters Patent is hereby corrected as shown below:

Column 7, line 51, delete "iincreasing" and insert therefor --increasing--.

Column 7, line 59, delete "regulat" and insert therefor --regulator--.

Column 7, line 68, delete "menas" and insert therefor --means--.

Column 8, line 6, delete "an" and insert therefor --on--.

Column 8, line 24, delete "incerases" and insert therefor --increases--.

Column 8, line 31, delete "generat!ng" and insert therefor --generating--.

Column 8, line 32, delete "nad" and insert therefor --and--.

Column 8, line 33, delete "voltgge" and insert therefor --voltage--.

Signed and Sealed this

Fifteenth Day of August, 1989

*Attest:*

DONALD J. QUIGG

*Attesting Officer*  *Commissioner of Patents and Trademarks*